(12) United States Patent
Nishi et al.

(10) Patent No.: US 8,899,307 B2
(45) Date of Patent: Dec. 2, 2014

(54) COOLING DEVICE

(75) Inventors: Shinsuke Nishi, Aichi-ken (JP); Shogo Mori, Aichi-ken (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 76 days.

(21) Appl. No.: 13/444,001

(22) Filed: Apr. 11, 2012

(65) Prior Publication Data

US 2012/0267074 A1 Oct. 25, 2012

(30) Foreign Application Priority Data

Apr. 19, 2011 (JP) ................ 2011-093183

(51) Int. Cl.
*F28F 7/00* (2006.01)
*H01L 23/473* (2006.01)
*H05K 7/20* (2006.01)

(52) U.S. Cl.
CPC ................... *H01L 23/473* (2013.01)
USPC ............ 165/80.4; 165/170; 165/104.33

(58) Field of Classification Search
CPC .... H01L 23/473; F28F 13/08; F28F 2250/04; F28F 2250/104; F28F 2250/102
USPC .......... 165/80.4, 104.33, 80.2, 170; 361/699, 361/702; 257/714; 372/35
See application file for complete search history.

(56) References Cited

U.S. PATENT DOCUMENTS

| 4,714,107 A * | 12/1987 | Adsett | ........................ 165/166 |
| 5,005,640 A * | 4/1991 | Lapinski et al. | ............. 165/170 |
| 5,105,429 A * | 4/1992 | Mundinger et al. | ............ 372/34 |
| 6,097,744 A * | 8/2000 | Takigawa et al. | ............... 372/34 |
| 6,804,275 B2 * | 10/2004 | Miyajima et al. | ............... 372/36 |

(Continued)

FOREIGN PATENT DOCUMENTS

| JP | 02-100348 | 4/1990 |
| JP | 2006-287108 | 10/2006 |
| JP | 2006-310363 | 11/2006 |

(Continued)

OTHER PUBLICATIONS

Office Action from German Patent Office in DE Patent Application No. 102012206360.9, dated Oct. 18, 2013.

(Continued)

*Primary Examiner* — Tho V Duong
(74) *Attorney, Agent, or Firm* — Greenblum & Bernstein, P.L.C.

(57) ABSTRACT

A cooling device includes a base, first and second heat generating parts connected to the base, first and second passages formed in the base and a partition wall disposed in the base. Liquid refrigerant flows through the first and the second passages for cooling the first and the second heat generating parts, respectively. The first and the second passages are stacked one above the other through the partition wall in the base. The partition wall includes a first region opened to allow liquid refrigerant in the first passage to flow into the second passage and a second region located on the side of the first region to allow liquid refrigerant in the first passage to flow toward the downstream end of the first passage. The first region is formed such that an opening area of the first region is greater than an opening area of the first passage.

9 Claims, 7 Drawing Sheets

(56) References Cited

U.S. PATENT DOCUMENTS

| | | | |
|---|---|---|---|
| 6,895,026 B2* | 5/2005 | Miyajima et al. | 372/36 |
| 7,492,595 B2* | 2/2009 | Yoshioka et al. | 361/699 |
| 2001/0004312 A1* | 6/2001 | Miyajima et al. | 361/702 |
| 2001/0004370 A1 | 6/2001 | Miyajima et al. | |
| 2009/0141758 A1* | 6/2009 | Miyajima et al. | 372/36 |

FOREIGN PATENT DOCUMENTS

| | | |
|---|---|---|
| JP | 2007-184349 | 7/2007 |
| JP | 2009-176871 | 8/2009 |
| JP | 2011-071398 | 4/2011 |

OTHER PUBLICATIONS

Office Action from State Intellectual Property Office (SIPO) of People's Republic of China in Chinese Patent Application No. 201210114876.X, dated Apr. 22, 2014, along with an English translation thereof.

* cited by examiner

COOLING DEVICE

BACKGROUND OF THE INVENTION

The present invention relates to a cooling device that cools a heat generating part connected to a base by using liquid refrigerant flowing through the base.

Japanese Patent Application Publication No. 2006-287108 discloses a stacked cooling device having therein stacked refrigerant passages for cooling heat generating part such as an electronic part. In the stacked cooling device disclosed in this above Publication, the part to be cooled is disposed between any two adjacent refrigerant passages.

For improving the cooling efficiency in such stacked cooling device, liquid refrigerant is flowed in the refrigerant passages turning in alternate directions. For accomplishing the cooling efficiency, a communication passage may be formed in the cooling device for providing communication between any two adjacent refrigerant passages. In the cooling device having such communication passage, however, there is a fear that the cooling performance of the stacked cooling device may be decreased due to an increased amount of liquid refrigerant that flows through the communication passage into the second passage without reaching the downstream end of the first passage.

The present invention is directed to providing a cooling device having stacked refrigerant passages that suppresses the reduction of its cooling performance.

SUMMARY OF THE INVENTION

In accordance with the present invention, a cooling device includes a base, first and second heat generating parts, first and second passages and a partition wall. The first and the second heat generating parts are connected to the base. The first and the second passages are formed in the base, and liquid refrigerant flows through the first and the second passages for cooling the first and the second heat generating parts, respectively. The partition wall is disposed in the base, and the first and the second passages are stacked one above the other through the partition wall in the base. The partition wall includes a first region opened to allow liquid refrigerant in the first passage to flow into the second passage and a second region located on the side of the first region to allow liquid refrigerant in the first passage to flow toward the downstream end of the first passage. The first region is formed such that an opening area of the first region is greater than an opening area of the first passage in a direction perpendicular to a flowing direction of liquid refrigerant in the first passage.

Other aspects and advantages of the invention will become apparent from the following description, taken in conjunction with the accompanying drawings, illustrating by way of example the principles of the invention.

BRIEF DESCRIPTION OF THE DRAWINGS

The invention together with objects and advantages thereof, may best be understood by reference to the following description of the presently preferred embodiments together with the accompanying drawings in which.

DETAILED DESCRIPTION OF THE PREFERRED EMBODIMENTS

Figure 1:
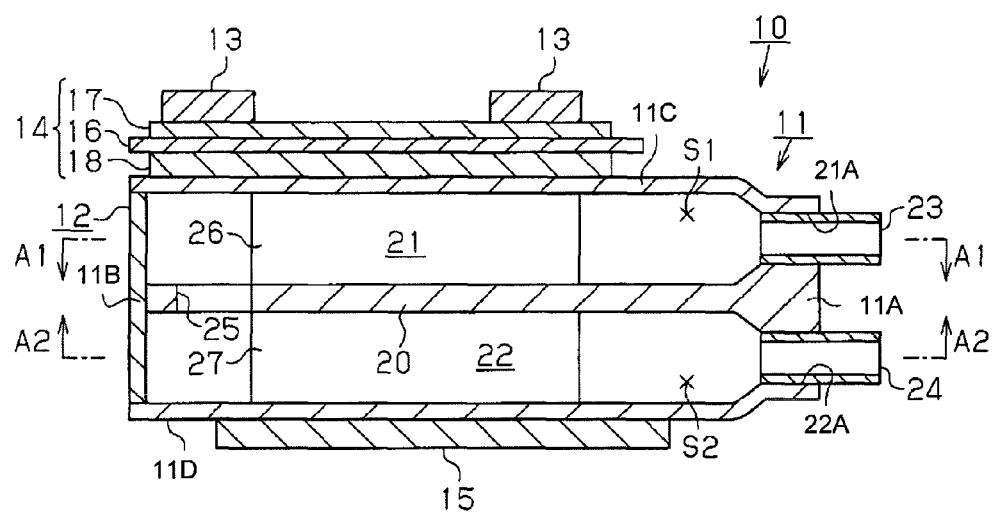
FIG. 1 is a longitudinal cross-sectional view of a semiconductor apparatus having a cooling device according to a first preferred embodiment of the present invention.
Figure 2:
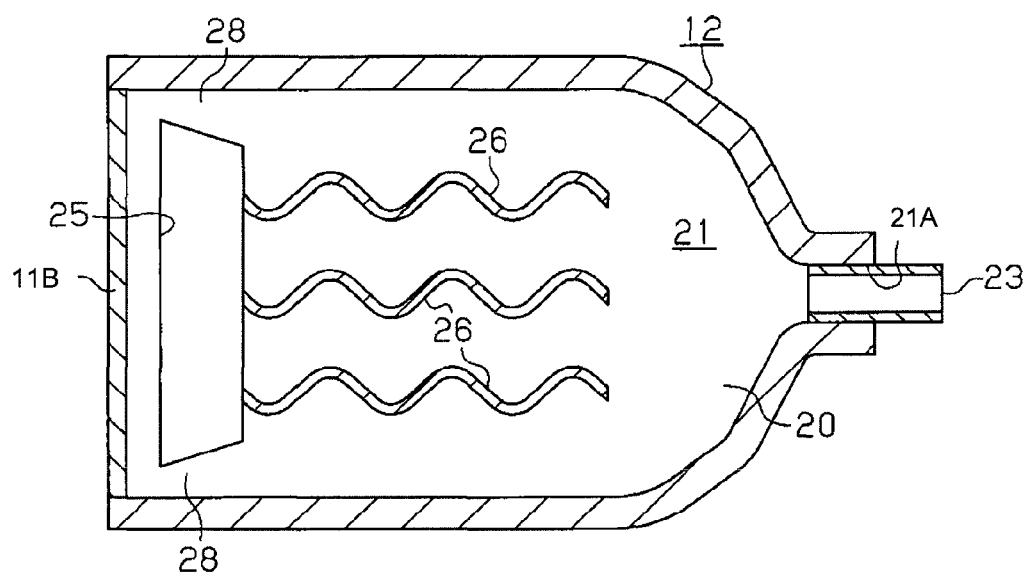
FIG. 2 is a cross-sectional view that is taken along the line A1-A1 in FIG. 1.
Figure 3:
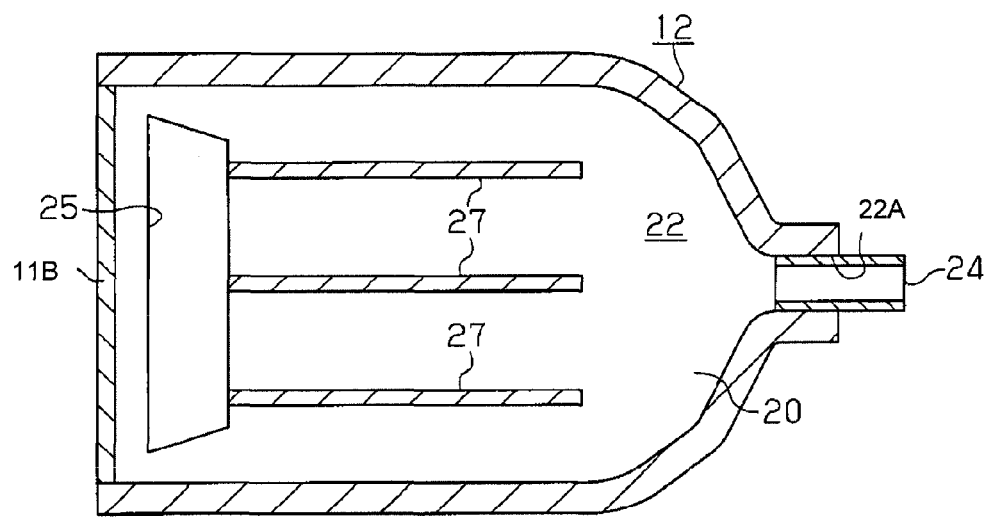
FIG. 3 is a cross-sectional view that is taken along the line A2-A2 in FIG. 1.

The following will describe a first preferred embodiment of the present invention with reference to FIGS. 1 through 3. Referring firstly to FIG. 1, reference numeral 10 designates a semiconductor apparatus 10 including a cooling device 11 having a base 12, semiconductor elements 13, a metallic circuit board 14 and a heat spreader 15. The cooling device 11 is of a stack type cooling device which has stacked refrigerant passages. The semiconductor element 13 serves as a first heat generating part (electronic part), and the heat spreader 15 as a second heat generating part. The semiconductor apparatus 10 is formed by joining the heat spreader 15 and the metallic circuit board 14 on which the semiconductor elements 13 are mounted, to the base 12 of the cooling device 11. The metallic circuit board 14 serves as a wiring layer and a joining layer. The metallic circuit board 14 has metal plates 17, 18 and an insulated substrate 16. The metallic circuit board 14 is formed by joining the metal plates 17, 18 to the opposite surfaces of the insulated substrate 16. Each semiconductor element 13 is made of an IGBT (Insulated Gate Bipolar Transistor) or a diode.

The following will describe the structure of the cooling device 11 of the first preferred embodiment in detail. The inner space of the base 12 is divided by a partition plate 20 into two spaces disposed one above the other, namely the upper space S1 and the lower space S2. According to the first preferred embodiment of the present invention, the upper space S1 is formed in the base 12 as a first passage 21 through which liquid refrigerant flows, and the lower space S2 is formed in the base 12 as a second passage 22 through which liquid refrigerant flows. The first and the second passages 21, 22 are stacked one above the other in the base 12 through the partition plate 20 disposed in the base 12. In the first preferred embodiment, the first passage 21 is stacked above the second passage 22.

An inlet 21A is formed in the base 12 of the cooling device 11 through which liquid refrigerant is introduced into the first passage 21. An outlet 22A is formed in the base 12 through which liquid refrigerant in the second passage 22 is discharged out. A first tube 23 is connected at one end thereof to the inlet 21A and at the other end thereof to a liquid refrigerant supply source (not shown), and a second tube 24 is connected at one end thereof to the outlet 22A and at the other end thereof to a radiator (not shown).

The base 12 of the cooling device 11 has end walls 11A, 11B facing each other. An opening 25 is formed through the partition plate 20 at a position adjacent to the end wall 11B for communication between the first and the second passages 21, 22. Thus, the cooling device 11 has a flow passage for introducing liquid refrigerant through the inlet 21A into the first passage 21, flowing the liquid refrigerant through the first passage 21, the opening 25 and the second passage 22 and discharging the liquid refrigerant out of the cooling device 11 through the outlet 22A.

Referring to FIG. 2, a plurality of first inner fins 26, or the three first inner fins 26 in the present embodiment, is disposed in the first passage 21, spaced at a predetermined interval in the width direction of the first passage 21 and each extending in the flowing direction of the liquid refrigerant that is perpendicular to the width of the first passage 21. The first inner fins 26 are used for cooling the liquid refrigerant by heat exchange in the first passage 21 while allowing the liquid refrigerant to flow from the inlet 21A to the opening 25. Referring to FIG. 3, a plurality of second inner fins 27 is disposed in the second passage 22 and spaced at a predetermined interval in the width direction of the second passage 22 and each extending in the flowing direction of liquid refrigerant that is perpendicular to the width of the second passage 22. The second inner fins 27 are used for cooling liquid refrigerant by heat exchange in the second passage 22 while allowing the liquid refrigerant to flow from the opening 25 to the outlet 22A.

The base 12 of the cooling device 11 has a top plate 11C and a bottom plate 11D, each having a surface for mounting heat generating parts. The first inner fins 26 are joined to the partition plate 20 and to the top plate 11C, so that the first passage 21 is formed by the first inner fins 26, the partition plate 20 and the top plate 11C. The second inner fins 27 are joined to the partition plate 20 and to the bottom plate 11D, so that the second passage 22 is formed by the second inner fins 27, the partition plate 20 and the bottom plate 11D. Thus, the first and the second inner fins 26, 27 form a part of the base 12.

As shown in FIG. 2, each first inner fin 26 is formed in a wave shape, as seen from the top of the base 12. As shown in FIG. 3, each second inner fin 27 is formed in a linear shape, as seen from the top of the base 12. The difference in shape between the first and the second inner fins 26 and 27 causes a difference in cooling performance between the first and the second passages 21 and 22. Specifically, when the first and the second inner fins 26 and 27 have the same distance, height and thickness, the surface area of the first inner fin 26 having a wave shape is greater than that of the second inner fin 27 having a linear shape and hence being smaller than the first inner fin 26. Therefore, when the first and the second inner fins 26 and 27 are disposed in the same number in the first and the second passages 21, 22, respectively, the total surface area of the first inner fins 26 to be in contact with liquid refrigerant flowing through the refrigerant passage is greater than that of the second inner fins 27. Since the first inner fin 26 has a wave shape and hence curved surfaces, the liquid refrigerant into a space between the curved surfaces is agitated. Thus, according to the first preferred embodiment, the first passage 21 in which the first inner fins 26 are disposed has a higher cooling performance than the second passage 22 in which the second inner fins 27 are disposed.

In the cooling device 11 which has the first and the second passages 21, 22 having the different cooling performances, parts to be cooled by the first and the second passages 21, 22 are selected for the first and the second passages 21, 22 depending on the amount of heat generated by the parts, which helps to provide effective cooling of the parts in the cooling device 11. In other words, when parts having different heat generation are joined to the cooling device 11, the increase of the manufacturing cost of the cooling device 11 may be suppressed by using the first and the second inner fins 26, 27 of different shapes for the first and the second passages 21, 22. For example, using the second passage 22 of simplified structure for cooling the heat spreader 15 that generates less heat than the electronic part, the cooling device 11 may be made for less cost in comparison with a case in which all refrigerant passages have a complicated structure as the first passage 21. In the cooling device 11 of the first preferred embodiment, the first passage 21 is used for cooling a part generating a relatively large amount of heat, such as the semiconductor elements 13, while the second passage 22 is used for cooling a part generating a relatively small amount of heat, such as the heat spreader 15.

The following will describe the opening 25 formed through the partition plate 20 in detail. The opening 25 is formed in a trapezoidal shape in plan view as seen from the top of the base 12, as shown in FIGS. 2, 3. The opening 25 is formed in such a trapezoid shape that its large base is located adjacent to the end wall 11B of the base 12 of the cooling device 11. In other words, the opening 25 is formed to be widened toward the downstream end of the first passage 21 with respect to the flowing direction of the liquid refrigerant in the first passage 21, as shown in FIG. 2. In the first passage 21 having the opening 25 of a trapezoidal shape, liquid refrigerant flowing regions 28 are provided on the opposite sides of the opening 25. The opening 25 serves as a communication space (first region) which provides fluid communication between the first and the second passages 21 and 22. The liquid refrigerant flowing region 28 serves as a non-communication space (second region) which provides no fluid communication between the first and the second passages 21 and 22.

The opening 25 is widened toward the downstream end of the first passage 21, while liquid refrigerant flowing region 28 is narrowed toward the same downstream end of the first passage 21. Thus, the opening width of the opening 25 is formed to be relatively narrow, so that the liquid refrigerant flowing through the first passage 21 and reaching the opening 25 flows easily to the downstream end of the first passage 21. The opening area of the opening 25 is formed to be greater than the opening or cross-sectional area of the first passage 21 in a direction perpendicular to the flowing direction of liquid refrigerant in the first passage 21. Thus, the liquid refrigerant flowing in the first passage 21 moves into the second passage 22 through the opening 25 smoothly without being accumulated in the first passage 21.

The opening 25 having a trapezoidal shape functions as the first region allowing liquid refrigerant in the first passage 21 to flow into the second passage 22. The liquid refrigerant flowing region 28 functions as the second region that allows liquid refrigerant to flow toward the downstream end of the first passage 21.

The following will describe the operation of the cooling device 11 of the first preferred embodiment for the semiconductor apparatus 10 shown in FIG. 1. When the semiconductor apparatus 10 is driven, heat generated by the heat generating part is transferred to the cooling device 11. Liquid refrigerant introduced into the first passage 21 through the inlet 21A flows downstream in the first passage 21 toward the opening 25. The liquid refrigerant flowing in contact with the first inner fins 26 is cooled by heat exchange and then flows into the second passage 22 through the opening 25. A part of the liquid refrigerant reaching the opening 25 flows further downstream past the liquid refrigerant flowing region 28 located on the opposite sides of the opening 25 without flowing directly into the second passage 22. That is, the liquid refrigerant flows through the opening 25 into the second passage 22 after reaching the downstream end of the first passage 21, as well as directly into the second passage 22 through the opening 25. In the cooling device 11 of the first preferred embodiment of the present invention, the liquid refrigerant flows in the entire refrigerant passage (the whole inside of the base 12), thus suppressing the reduction of cooling performance of the cooling device 11.

The liquid refrigerant flowing into the second passage 22 through the opening 25 then flows through the second passage 22 in a direction that is opposite to the liquid refrigerant flowing direction in the first passage 21. The liquid refrigerant flows in contact with the second inner fins 27 in the second passage 22 thereby to be cooled by heat exchange and is discharged out of the cooling device 11 through the outlet 22A.

According to the first preferred embodiment of the present invention, the following advantageous effects may be accomplished.

(1) The liquid refrigerant flowing regions 28 formed on the opposite sides of the opening 25 make the liquid refrigerant to flow toward the downstream end of the first passage 21 past the opening 25. Thus, the liquid refrigerant flows in the entire first passage 21 or the entire interior of the base 12, thereby effectively suppressing the reduction of cooling performance of the cooling device 11. Even in a case that parts are mounted densely on the cooling device 11 or at a position adjacent to the end wall 11B, the liquid refrigerant flowing in the entire refrigerant passage effectively cools the parts without reducing the cooling performance of the cooling device 11.

(2) Forming the opening 25 in a trapezoidal shape, large liquid refrigerant flowing regions 28 may be provided on the opposite sides of the opening 25. Thus, liquid refrigerant can flow easily toward the downstream end of the first passage 21, thereby suppressing the reduction of the cooling performance of the cooling device 11. The opening 25 which is widened toward the downstream end of the first passage 21 helps to enlarge the flowing width of the liquid refrigerant flowing from the first passage 21 to the second passage 22. The flow of liquid refrigerant flowing in the cooling device 11 is constantly divided into branches in the cooling device 11.

(3) The heat spreader 15 as a part to be cooled by the second passage 22 generates less heat than electronic parts, such as the semiconductor elements 13 as a part to be cooled by the first passage 21. Thus, the cooling performance of the second passage 22 may be lower than that of the first passage 21 to simplify the structure of the second passage 22, thereby suppressing the increase of the cost of the cooling device 11.

(4) In the manufacturing process, the cooling performance of the refrigerant passages may be changed easily only by modifying the structure of the inner fins disposed in the refrigerant passages in accordance with the parts to be cooled. Thus, it is easy to change the cooling performances of the first and the second passages 21, 22 in accordance with parts being cooled. The liquid refrigerant contacting area with the base 12 of the cooling device 11 may be decreased to reduce the cooling performance of the first and the second passages 21, 22 and increased to enhance the cooling performance of the first and the second passages 21, 22. If the heat generation of parts is relatively small, the cooling device 11 may have a refrigerant passage having a simple structure for cooling for reducing the manufacturing cost of the cooling device 11.

(5) The second inner fins 27 having a linear shape and disposed in the second passage 22 is simpler in shape than the first inner fins 26 having a wave shape and disposed in the first passage 21. Liquid refrigerant flowing in the second passage 22 receives less resistance than that in the first passage 21. Therefore, the pressure loss in the second passage 2 is lower than that in the first passage 21. In other words, a refrigerant passage which does not need to have a high cooling performance may be made in such a simple structure so that pressure loss in the refrigerant passage may be reduced.

(6) The first and the second passages 21, 22 communicate with each other through the opening 25 without using extra parts such as a pipe, a hose and a connector, so that the structure of the cooling device 11 is simplified and the increase of the manufacturing cost of the cooling device 11 is suppressed, accordingly.

(7) In the cooling device of the present embodiment, liquid refrigerant firstly flows in the first passage 21 that is used for cooling parts having a relatively high heat generation. Such parts are cooled by liquid refrigerant which is not heated yet by heat exchange, and parts generating less heat is cooled by liquid refrigerant which is heated by heat exchange. Thus, cooling is performed effectively in the cooling device 11.

Figure 4:
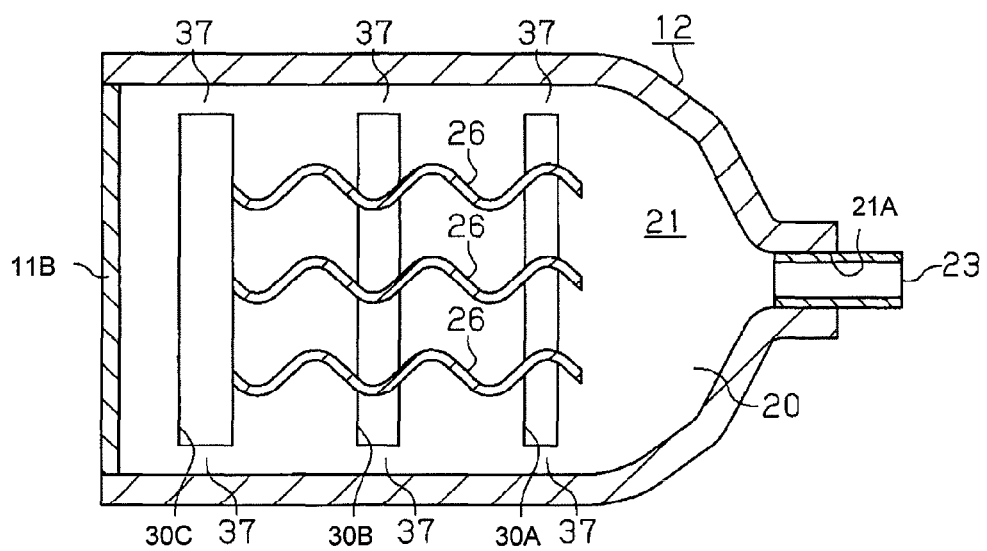
FIG. 4 is a longitudinal cross-sectional view of a cooling device according to a second preferred embodiment of the present invention.

The following will describe a second preferred embodiment of the present invention with reference to FIG. 4. In the following description of the second preferred embodiment, the same reference numerals denote the same or similar elements or components of the first preferred embodiment, and the description thereof will be omitted.

According to the second preferred embodiment of the present invention, the partition plate 20 has three openings 30A, 30B and 30C formed therethrough for communication between the first passage 21 and the second passage 22 in the direction of the stack of the first and the second passages 21, 22. The openings 30A through 30C are formed in the partition plate 20 spaced at a predetermined interval in the flowing direction of liquid refrigerant in the first passage 21. As seen from FIG. 4, the openings 30A through 30C are different from each other in the opening area. Among the openings 30A through 30C, the opening 30A has the smallest opening area, and the opening 30C has the largest. In other words, the opening 30A through 30C are aligned in ascending order of opening area toward the downstream end of the first passage 21. The opening areas of the respective openings 30A through 30C are smaller than the opening or cross-sectional area of the first passage 21 that is perpendicular to the flowing direction of liquid refrigerant in the first passage 21. The sum of such opening areas of the openings 30A through 30C is the same as or greater than the above opening or cross-sectional area of the first passage 21 in a direction perpendicular to the flowing direction of liquid refrigerant in the first passage 21. Thus, the liquid refrigerant flowing in the first passage 21, liquid refrigerant is not accumulated in the first passage 21, moves into the second passage 22 through the openings 30A through 30C smoothly without being accumulated in the first passage 21.

The liquid refrigerant flowing regions 37 positioned on the opposite sides of the openings 30A through 30C correspond to the refrigerant flowing regions that allow liquid refrigerant to flow past the openings 30A through 30C. The openings 30A, 30B and 30C are formed through the partition plate 20 in this order as viewed downstream with respect to the flowing direction of liquid refrigerant in the first passage 21. In other words, the opening 30A is located closest to the upstream end or the inlet 21A of the first passage 21, and the opening 30C is located closest to the downstream end of the first passage 21. The plurality of openings 30A through 30C functions as the first region through which liquid refrigerant in the first passage 21 flows into the second passage 22. The liquid refrigerant flowing region 37 formed on the opposite sides of the respective openings 30A through 30C functions as the second region past which liquid refrigerant flows toward the downstream end of the first passage 21.

According to the second preferred embodiment of the present invention, liquid refrigerant introduced into the first passage 21 flows downstream or toward the end wall 11A of the first passage 21 and a part of the liquid refrigerant passes through the openings 30A, 30B and 30C successively in this order into the second passage 22. Since the opening area of each of the openings 30A through 30C is smaller than the opening or cross-sectional area of the first passage 21, all liquid refrigerant does not flow directly into the second passage 22 without reaching the downstream end of the first passage 21. The openings 30A through 30C serve as the second region like the liquid refrigerant flowing region 37 that allows part of the liquid refrigerant to flow to the downstream end of the first passage 21. Liquid refrigerant flowing around the liquid refrigerant flowing region 37 and the openings 30A through 30C flows to and reaches the downstream end of the first passage 21.

The second preferred embodiment offers the following effects in addition to the effects (1) through (7) of the first preferred embodiment.

(8) The provision of a plurality of the openings 30A through 30C makes the liquid refrigerant in the first passage 21 to flow successively into the second passage 22. Thus, the flow of liquid refrigerant flowing in the cooling device 11 is constantly divided into branches in the cooling device 11. Arranging the opening 30A with the smallest opening area adjacent to the upstream end of the first passage 21 and the opening 30C with the largest opening area adjacent to the downstream end of the first passage 21, the liquid refrigerant does not all flow through the openings 30A and 30B into the second passage 22, and part of liquid refrigerant reaches the opening 30C. That is, the liquid refrigerant flows from the first passage 21 into the second passage 22 through the three different openings 30A through 30C.

(9) Forming the openings 30A through 30C such that their respective opening areas are smaller than the opening or cross-sectional area of the first passage 21, part of the liquid refrigerant is allowed to flow to the downstream end of the first passage 21, thereby suppressing the reduction of the cooling performance of the cooling device 11.

(10) In the second preferred embodiment according to which the cooling device has formed therein a plurality of the openings 30A through 30C, the speed of the liquid refrigerant flowing just below the openings 30A through 30C is increased.

Therefore, forming the openings 30A through 30C at positions corresponding to or just above the parts to be cooled by the second passage 22, the cooling performance of the cooling device 11 may be improved.

(11) If the openings 30A through 30C are formed such that the sum of their opening area is smaller than the opening or cross-sectional area of the first passage 21, the provision of a plurality of the openings 30A through 30C in the cooling device 11 may suppress the accumulation of the liquid refrigerant in the first passage 21.

Figure 5:
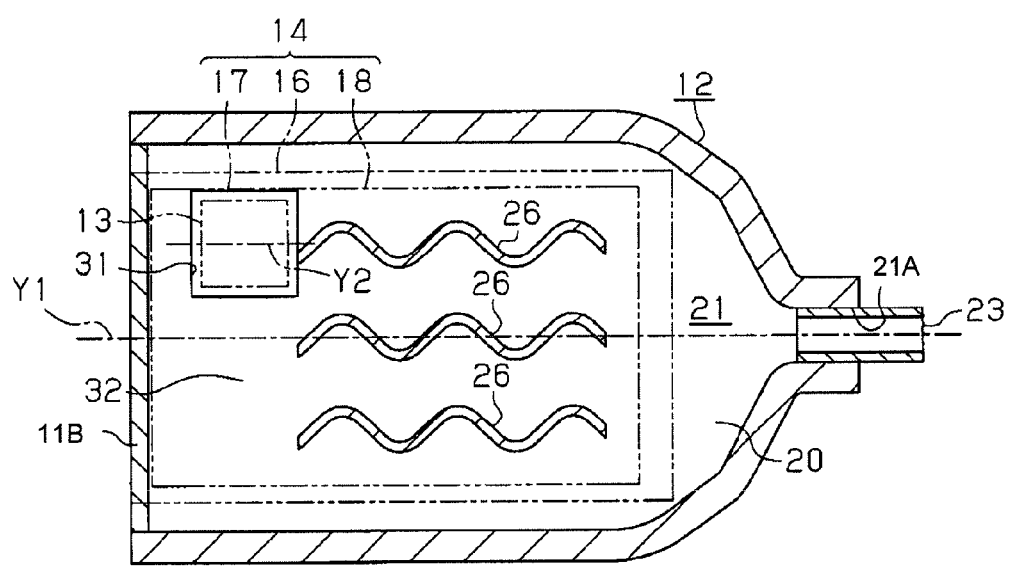
FIG. 5 is a cross-sectional view of a cooling device according to a third preferred embodiment of the present invention.

The following will describe a third preferred embodiment of the present invention with reference to FIG. 5. According to the third preferred embodiment of the present invention, an opening 31 is formed in the partition plate 20 for communication between the first passage 21 and the second passage 22 in the direction of the stack of the first and the second passages 21, 22. The opening 31 is formed in a square or rectangular shape in plan view.

The opening 31 is located such that the center Y2 of the width of the opening 31 is offset from the center Y1 of the width of the first passage 21 or the axis of the first passage 21 as viewed along the flowing direction of liquid refrigerant in the first passage 21. The opening 31 is located in an asymmetric position with respect to the center Y1 of the width of the first passage 21, or only on one side of the center Y1 in the first passage 21. The region on the partition plate 20 on opposite side of the center Y from the opening 31 serves as liquid refrigerant flowing region 32 that allows part of liquid refrigerant to flow to the downstream end in the first passage 21. The opening 31 is the communication region between the first and the second passage 21, 22, and the liquid refrigerant flowing region 32 serves as the non-communication region between the first and the second passage 21, 22. The opening area of the opening 31 is greater than the opening or cross-sectional area of the first passage 21 taken in a direction perpendicular to the flowing direction of liquid refrigerant in the first passage 21.

According to the third preferred embodiment of the present invention wherein the opening 31 is located at the above-mentioned offset position, liquid refrigerant flows easily to the downstream end of the first passage 21. The opening 31 functions as the first region that allows liquid refrigerant flowing in the first passage 21 to flow into the second passage 22. The liquid refrigerant flowing region 32 functions as the second region that allows liquid refrigerant to flow to the downstream end of the first passage 21. The opening 31 is located just below the semiconductor elements 13 as a part to be cooled by the refrigerant flowing in the first passage 21.

According to the third preferred embodiment of the present invention, liquid refrigerant introduced into the first passage 21 flows toward the downstream end of the first passage 21 or the end wall 11 B of the cooling device 11. A part of the liquid refrigerant flows through the opening 31 into the second passage 22, while the rest of the liquid refrigerant flows further downstream through the liquid refrigerant flowing region 32. That is, a part of liquid refrigerant flows directly into the second passage 22 through the opening 31, while the rest of the liquid refrigerant flows to the downstream end of the first passage 21, and then into the second passage 22 through the opening 31.

The third preferred embodiment offers the following effects, as well as the effects (3) through (7) of the first preferred embodiment.

(12) The liquid refrigerant flowing regions 28 formed on opposite sides of the opening 31 allow part of liquid refrigerant in the first passage 21 to flow toward the downstream end of the first passage 21. Thus, liquid refrigerant flows in the entire interior space of the first passage 21, thereby suppressing the reduction of the cooling performance of the cooling device 11.

(13) Providing the opening 31 just below the parts to be cooled, the flowing speed of liquid refrigerant is increased thereby to improve the cooling performance of the cooling device 11.

The above-described embodiments may be modified in various ways as exemplified below.

According to the first through third preferred embodiments of the present invention, the semiconductor elements 13 are mounted to the base 12 of the cooling device 11 through the metallic circuit board 14. Alternatively, the semiconductor elements 13 may be mounted directly to the base 12 of the cooling device 11.

In the first through third preferred embodiments of the present invention, the first and the second passages 21, 22 may be modified in such a way that the opening or cross-sectional area of the first passage 21 is smaller than the opening or cross-sectional area of the second passage 22, so that the cooling performance of the first passage 21 becomes higher than that of the second passage 22. Such modification allows the liquid refrigerant to flow in the first passage 21 at a speed that is higher than the speed at which the liquid refrigerant flows in the second passage 22 and, therefore, the cooling performance of the first passage 21 becomes higher than that of the second passage 22.

The inner fins in the first through third preferred embodiments of the present invention may be modified in such a way that the fins are provided only in the first passage 21 so that the cooling performance of the first passage 21 is higher than that of the second passage 22.

In the first through third preferred embodiments of the present invention, the inner fins may be modified to have a different shape, such as the shape of a pin fin.

Figure 6:
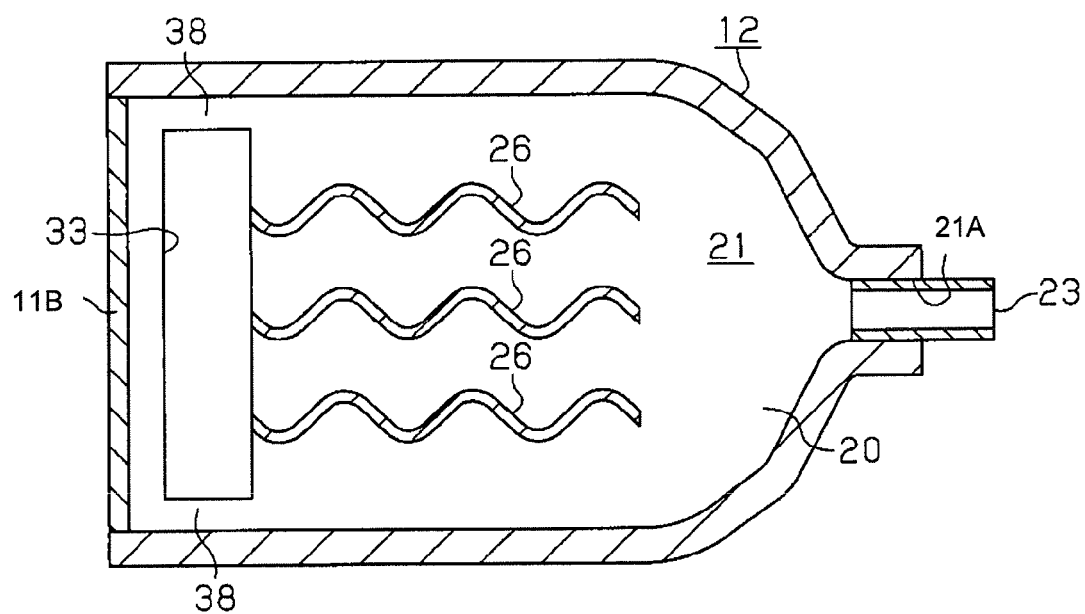
FIG. 6 is a cross-sectional top view of a cooling device according to another embodiment of the present invention.

In the first preferred embodiment, the opening 33 may be modified to have a rectangular shape in plan view, as shown in FIG. 6. In such a case, the regions on the opposite sides of the opening 33 correspond to the liquid refrigerant flowing region 38.

Figure 7:
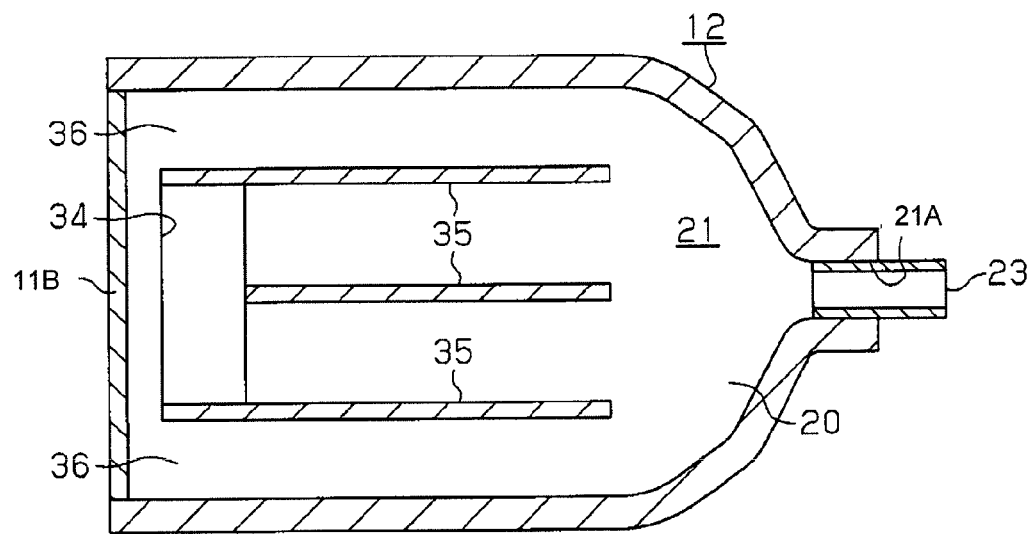
FIG. 7 is a cross-sectional view of a cooling device according to yet another embodiment of the present invention.

The first inner fins 26 of the first preferred embodiment may be replaced by linear-shaped inner fins 35, and the opening 34 may be formed in a rectangular shape, as shown in FIG. 7. Additionally, the inner fins 35 may be formed in such a way that the opening 34 is flanked at the opposite sides by the two outer inner fins 35 so that a part of liquid refrigerant reaches the downstream end of the first passage 21. In the first passage 21, part of the liquid refrigerant flowing through lateral side regions 36 reaches the downstream end of the first passage 21 along the inner fins 35. Thus, the lateral side regions 36 in the first passage 21 serve as the liquid refrigerant flowing regions of the present invention.

The opening 25 in the first preferred embodiment may be modified into such a triangular shape that the opening 25 is formed to be widened toward the downstream end of the first passage 21.

Alternatively, the opening 25 in the first preferred embodiment may be modified to be a plurality of such separate openings arranged along the liquid refrigerant flowing direction in the first passage 21 that each opening is widened toward the downstream end of the first passage 21. In such a case, the liquid refrigerant flowing regions 28 may be formed also between any two adjacent openings 25.

The openings 30A through 30C of the second preferred embodiment may be disposed with an increasing spaced interval toward the downstream end of the first passage 21. In such a case, the openings 30A through 30C may have the same or different opening areas. Furthermore, the number of the openings to be formed may be two or more than three.

The openings 30A through 30C of the second preferred embodiment may be modified to have a trapezoidal shape as in the first preferred embodiment.

The opening 31 of the third preferred embodiment may be modified into a plurality of openings. Alternatively the opening 31 may be modified in any of rectangular, trapezoidal and triangular shapes.

What is claimed is:

1. A cooling device, comprising:
a base;
a first heat generator connected to the base;
a second heat generator connected to the base;
a first passage formed in the base to have a constant width, liquid refrigerant allowed to flow through the first passage for cooling the first heat generator;
a second passage formed in the base, the liquid refrigerant allowed to flow through the second passage for cooling the second heat generator;
a partition wall disposed in the base, the first passage and the second passage being stacked one above the other in the base via the partition wall, the partition wall including:
a first region opened to allow the liquid refrigerant in the first passage to flow into the second passage; and
a second region located on a side of the first region to allow the liquid refrigerant in the first passage to flow toward a downstream end of the first passage,
wherein the first region is formed such that an opening area of the first region is greater than an opening area of the first passage having the constant width in a direction perpendicular to a flowing direction of the liquid refrigerant in the first passage.

2. The cooling device according to claim 1, wherein the first passage and the second passage have different liquid refrigerant contacting areas with the base.

3. The cooling device according to claim 2, wherein a first inner fin having a wave shape is disposed in the first refrigerant passage, and a second inner fin having a linear shape is disposed in the second refrigerant passage.

4. The cooling device according to claim 1, wherein the first region is an opening having a trapezoidal shape being widened toward the downstream end of the first passage with respect to the flowing direction of the liquid refrigerant in the first passage.

5. The cooling device according to claim 1, wherein the first region is an opening having a rectangular shape and located such that a center of the width of the opening is offset from a center of the width of the first passage as viewed along the flowing direction of the liquid refrigerant in the first passage.

6. The cooling device according to claim 1, wherein the first region is located one of below the first heat generator and above the second heat generator.

7. The cooling device according to claim 1, wherein the opening area of the first passage is smaller than an opening area of the second passage.

8. A cooling device, comprising:
a base;
a first heat generator connected to the base;
a second heat generator connected to the base;
a first passage formed in the base, liquid refrigerant allowed to flow through the first passage for cooling the first heat generator;
a second passage formed in the base, the liquid refrigerant allowed to flow through the second passage for cooling the second heat generator;
a partition wall disposed in the base, the first passage and the second passage being stacked one above the other in the base via the partition wall, the partition wall including:
a first region opened to allow the liquid refrigerant in the first passage to flow into the second passage; and
a second region located on a side of the first region to allow the liquid refrigerant in the first passage to flow toward a downstream end of the first passage,
wherein the first region is formed such that an opening area of the first region is greater than an opening area of the first passage in a direction perpendicular to a flowing direction of the liquid refrigerant in the first passage,
the first passage and the second passage have different liquid refrigerant contacting areas with the base, and
a first inner fin having a wave shape is disposed in the first refrigerant passage, and a second inner fin having a linear shape is disposed in the second refrigerant passage.

9. A cooling device, comprising:
a base;
a first heat generator connected to the base;
a second heat generator connected to the base;
a first passage formed in the base, liquid refrigerant allowed to flow through the first passage for cooling the first heat generator;
a second passage formed in the base, the liquid refrigerant allowed to flow through the second passage for cooling the second heat generator;
a partition wall disposed in the base, the first passage and the second passage being stacked one above the other in the base via the partition wall, the partition wall including:
a first region opened to allow the liquid refrigerant in the first passage to flow into the second passage; and
a second region located on a side of the first region to allow the liquid refrigerant in the first passage to flow toward a downstream end of the first passage,
wherein the first region is formed such that an opening area of the first region is greater than an opening area of the first passage in a direction perpendicular to a flowing direction of the liquid refrigerant in the first passage, and
the first region is an opening having a trapezoidal shape being widened toward the downstream end of the first passage with respect to the flowing direction of the liquid refrigerant in the first passage.

* * * * *